United States Patent
Narishige et al.

(10) Patent No.: US 9,412,617 B2
(45) Date of Patent: Aug. 9, 2016

(54) PLASMA PROCESSING METHOD AND PLASMA PROCESSING APPARATUS

(71) Applicant: TOKYO ELECTRON LIMITED, Tokyo (JP)

(72) Inventors: Kazuki Narishige, Miyagi (JP); Takanori Sato, Miyagi (JP); Manabu Sato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/409,053

(22) PCT Filed: Jul. 4, 2013

(86) PCT No.: PCT/JP2013/068327
§ 371 (c)(1),
(2) Date: Dec. 18, 2014

(87) PCT Pub. No.: WO2014/010499
PCT Pub. Date: Jan. 16, 2014

(65) Prior Publication Data
US 2015/0303069 A1    Oct. 22, 2015

Related U.S. Application Data

(60) Provisional application No. 61/672,437, filed on Jul. 17, 2012.

(30) Foreign Application Priority Data

Jul. 10, 2012    (JP) .................................. 2012-154698

(51) Int. Cl.
*H01L 21/302*    (2006.01)
*H01L 21/311*    (2006.01)
(Continued)

(52) U.S. Cl.
CPC ....... *H01L 21/31116* (2013.01); *H01J 37/3244* (2013.01); *H01J 37/32091* (2013.01); *H01J37/32165* (2013.01); *H01J 37/32449* (2013.01); *H01J 37/32568* (2013.01); *H01J 37/32715* (2013.01); *H01L 21/31144* (2013.01); *H01L 21/32137* (2013.01); *H01L 21/67069* (2013.01); *H01L 27/11556* (2013.01); *H01L 27/11582* (2013.01); *H01L 21/67109* (2013.01)

(58) Field of Classification Search
CPC ............ H01L 21/3065; H01L 21/3213; H01L 21/31116; H01L 21/336; H01L 21/312; H01L 21/31144; H01L 21/3113; H01L 21/67069
USPC ......... 438/706, 710, 712, 714, 717, 719, 720, 438/723; 156/345.44, 345.45, 345.47, 156/345.48
See application file for complete search history.

(56) References Cited

U.S. PATENT DOCUMENTS 7,122,479 B2 * 10/2006 Ohmoto ............ H01J 37/32082
216/67
7,910,283 B2 * 3/2011 Ogihara ................ C08G 77/48
430/270.1

(Continued)

FOREIGN PATENT DOCUMENTS

JP    2009-266944 A    11/2009

*Primary Examiner* — Lan Vinh
(74) *Attorney, Agent, or Firm* — Rothwell, Figg, Ernst & Manbeck, P.C.

(57) ABSTRACT

Plasma etching is performed while suppressing bowing during etching of a multi-layer film. The plasma etching is performed multiple times using a processing gas containing HBr gas and $C_4F_8$ gas, and the etching gradually forms recesses from a SiN layer through a laminated film. By adding a gas containing boron to the processing gas during the etching at a predetermined timing and at a predetermined flow ratio while etching the laminated film, a protective film is formed on side walls of the SiN layer that are exposed to the recess.

13 Claims, 15 Drawing Sheets

(51) Int. Cl.
*H01L 27/115* (2006.01)
*H01L 21/3213* (2006.01)
*H01J 37/32* (2006.01)
*H01L 21/67* (2006.01)

(56) References Cited

U.S. PATENT DOCUMENTS

| | | | |
|---|---|---|---|
| 2002/0016078 A1* | 2/2002 | Ionov | H01L 21/0276 438/710 |
| 2007/0117252 A1* | 5/2007 | Ogihara | C08G 77/48 438/72 |
| 2007/0119373 A1* | 5/2007 | Kumar | C23C 16/509 118/723 L |
| 2007/0294043 A1* | 12/2007 | Shannon | H01J 37/32174 702/57 |
| 2008/0057729 A1* | 3/2008 | Shen | H01L 21/32137 438/735 |
| 2009/0004870 A1* | 1/2009 | Liu | H01L 21/28282 438/710 |
| 2009/0268522 A1 | 10/2009 | Maejima | |

\* cited by examiner

PLASMA PROCESSING METHOD AND PLASMA PROCESSING APPARATUS

CROSS REFERENCE TO RELATED APPLICATION

This application is a 35 U.S.C. 371 National Phase Entry Application from PCT/JP2013/068327, filed Jul. 4, 2013, which claims priority to and the benefit of U.S. Provisional Application No. 61/672,437, filed Jul. 17, 2012 and Japanese Patent Application No. 2012-154698, filed Jul. 10, 2012, the disclosures of which are incorporated herein in their entirety by reference.

FIELD OF THE INVENTION

The present invention relates to a plasma processing method and a plasma processing apparatus, for etching a multilayer film formed on a substrate to be processed by using a plasma.

BACKGROUND OF THE INVENTION

A three dimensional stacked semiconductor memory such as a 3D-NAND flash memory or the like includes a laminated film in which different types of layers are laminated alternately multiple times (see, e.g., Patent Document 1). The laminated film may have a deep recess (hole such as opening and/or trench such as groove) penetrating through a base film. Such a deep hole is formed by plasma etching.

In the plasma processing for etching such a multilayer film, when each of the different layers of the laminated film is etched, the number of etching is increased as the number of laminated layers is increased, which leads to decrease in throughput. To that end, the laminated film is plasma-etched by using a processing gas containing gases required for etching the respective different layers. As a result, a recess penetrating through the different layers can be formed by performing the plasma etching only once. In order to etch the laminated film, a mask layer having patterned openings for forming recesses in the laminated film is formed on the laminated film and, then, the laminated film is plasma-etched while using the mask layer as a mask.

Patent Document 1: Japanese Patent Application Publication No. 2009-266944

Meanwhile, the laminated film may include a layer (e.g., silicon nitride (SiN) layer) that is easily etched by the processing gas for etching the laminated film. A processing gas same as that used for the laminated film may be also used in the case of etching such multilayer film having the SiN layer. However, as the etching proceeds, from the SiN layer, through the laminated film, a side surface of the SiN layer exposed in the formed recess is also etched.

The side surface of the SiN is etched such that the opening width is gradually increased in a depth direction of the SiN layer. Therefore, an abnormal etching shape, e.g., bowing, occurs at the recess formed from the SiN layer through the laminated film.

SUMMARY OF THE INVENTION

In view of the above, the present invention provides a plasma processing method and a plasma processing apparatus capable of suppressing the occurrence of an abnormal etching shape in the case of plasma-etching the multilayer film including the SiN film.

In accordance with an aspect of the present invention, there is provided a plasma processing method including: providing an upper electrode and a lower electrode in a processing chamber to be opposite to each other; providing a substrate to be processed on the lower electrode; generating a plasma of a processing gas by applying an RF power for plasma generation having a frequency ranging from 27 MHz to 60 MHz to the lower electrode and applying an RF bias power having a frequency ranging from 380 kHz to 1 MHz to the lower electrode; and plasma etching a multilayer film formed on the substrate to be processed while using a patterned mask layer as a mask.

The multilayer film includes a laminated film in which first films and second films are alternately laminated and a silicon nitride layer formed on the laminated film, dielectric constant of the first films being different from that of the second films.

The plasma etching is performed multiple times by introducing into the processing chamber the processing gas containing a fluorocarbon-based gas and at least one of bromine-containing gas, chlorine-containing gas, and iodine-containing gas, so that a recess is formed to gradually extend from the silicon nitride layer through the laminated film.

Etching of the laminated film proceeds while forming a protective film on a sidewall of the silicon nitride layer exposed to the recess by adding a boron-containing gas to the processing gas at a predetermined flow rate ratio and at a predetermined timing.

In accordance with another aspect of the present invention, there is provided a plasma processing apparatus for plasma etching a multilayer film formed on a substrate to be processed by generating a plasma of a processing gas in a processing chamber while using a patterned mask layer as a mask.

The plasma processing apparatus includes: an upper electrode provided in the processing chamber; and a lower electrode disposed to opposite to the upper electrode, for mounting thereon the substrate to be processed having the multilayer film formed thereon, the multilayer film including a laminated film in which first films and second films are alternately laminated and a silicon nitride layer formed on the laminated film, dielectric constant of the first films being different from that of the second films.

The plasma processing apparatus further includes: a first high frequency power supply configured to apply to the lower electrode a high frequency power for plasma generation having a frequency ranging from 27 MHz to 60 MHz; a second high frequency power supply configured to apply to the lower electrode a high frequency bias power having a frequency ranging from 380 kHz to 1 MHz; and a control unit configured to introduce into the processing chamber the processing gas containing fluorocarbon-based gas and at least one of bromine-containing gas, chlorine-containing gas and iodine-containing gas and apply the high frequency power for plasma generation from the first high frequency power supply and the high frequency bias power from the second high frequency power supply to the lower electrode, so that a recess is formed to gradually extend from the silicon nitride layer through the laminated film.

In the plasma etching, the control unit allows etching of the laminated film to proceed while forming a protective film on a sidewall of the silicon nitride film exposed to the recess by controlling boron-containing gas to be added to the processing gas at a predetermined flow rate ratio and at a predetermined timing.

The boron-containing gas may be introduced at least in an initial plasma etching. In this case, the boron-containing gas may be introduced from an initial plasma etching to a plasma etching of a predetermined cycle, or the boron-containing gas may be introduced from the initial plasma etching to a final plasma etching.

The flow rate ratio of the boron-containing gas may be gradually decreased as the etching of the laminated film proceeds. In this case, the flow rate ratio of the boron-containing gas may be decreased whenever the plasma etching is executed a predetermined number of times.

The high frequency bias power applied to the lower electrode may be increased as the etching of the laminated film proceeds. In this case, the high frequency bias power applied to the lower electrode may be increased whenever the plasma etching is executed a predetermined number of times.

In the initial plasma etching, the flow rate ratio of the boron-containing gas with respect to HBr gas may be set at least in a range from 10% to 40%.

The boron-containing gas may be one of boron trifluoride, boron trichloride, and boron oxide.

A temperature of the substrate to be processed is preferably controlled in a range from 150° C. to 200° C. at least during the plasma etching performed multiple times. In this case, each of the first films and each of the second films may be respectively a silicon oxide film and a polysilicon film.

Effect of the Invention

In accordance with the present invention, the plasma etching is performed by using the processing gas for etching the laminated film which is added with a boron-containing gas that protects the sidewall of the silicon nitride layer (SiN layer), so that the etching can proceed in the depth direction of the laminated film while suppressing the occurrence of an abnormal etching shape such as bowing or the like.

DETAILED DESCRIPTION OF THE EMBODIMENTS

Figure 1:
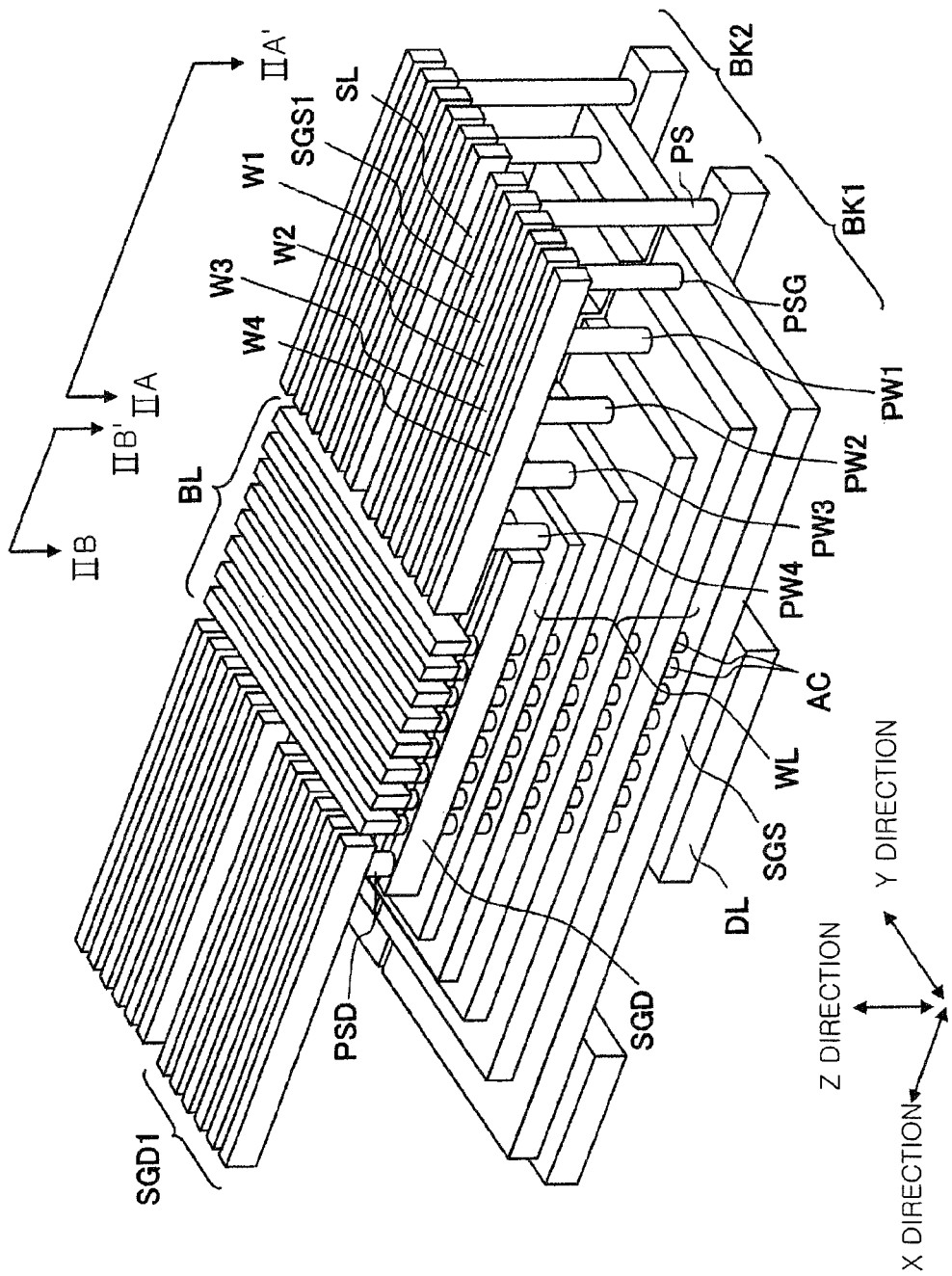
FIG. 1 schematically shows a structure of a three dimensional stacked semiconductor memory that can be manufactured by a multilayer film etching process of a plasma processing method in accordance with an embodiment of the present invention.

Hereinafter, embodiments of the present invention will be described with reference to the accompanying drawings. Throughout the specification and the drawings, like reference numerals will be used for like parts having substantially the same functions and redundant description thereof will be omitted.

(Structure of Three Dimensional (3D) Stacked Semiconductor Memory)

Figure 2A:
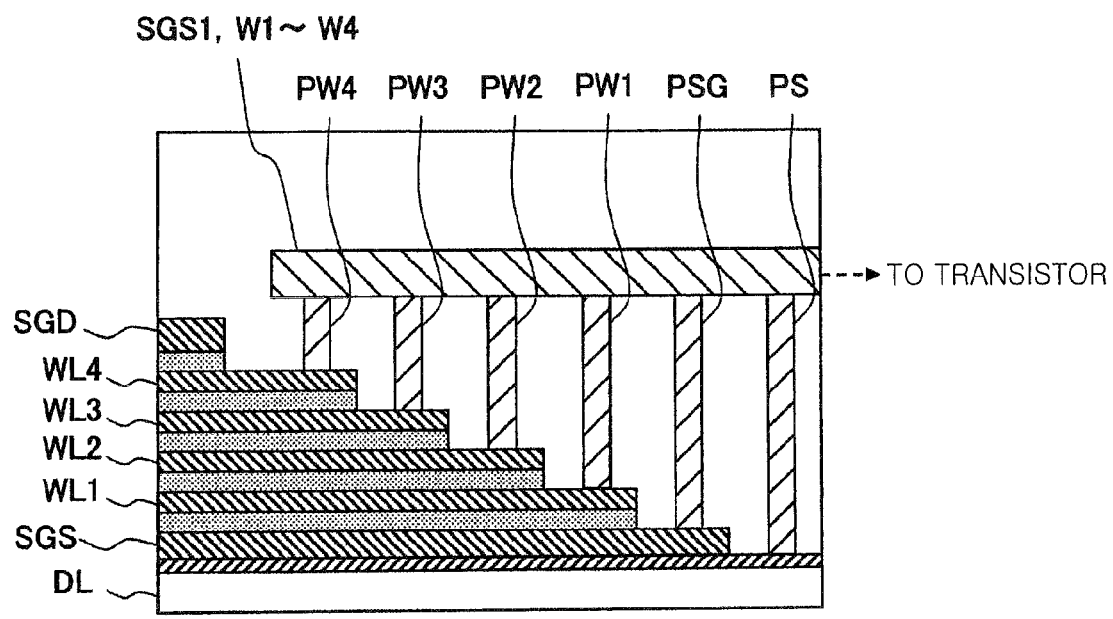
FIG. 2A is a cross sectional view taken along line IIA-IIA' shown in FIG. 1.
Figure 2B:
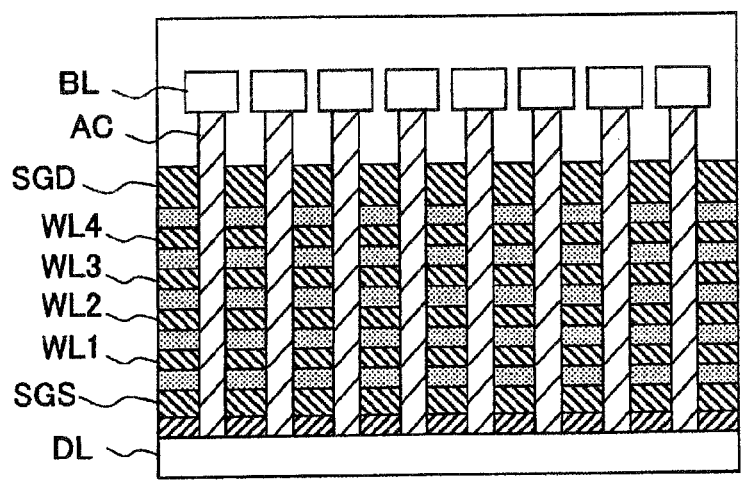
FIG. 2B is a cross sectional view taken along line IIB-IIB' shown in FIG. 1.

First, a specific configuration example of a 3D stacked semiconductor memory that can be manufactured by steps of a plasma processing method in accordance with an embodiment of the present invention will be described with reference to corresponding drawings. Here, a 3D-NAND flash memory is used as an example of the 3D stacked semiconductor memory. FIG. 1 is a perspective view schematically showing a structure of the 3D stacked semiconductor memory. FIG. 2A is a cross sectional view of the 3D-NAND flash memory which is taken along the line IIA-IIA' shown in FIG. 1. FIG. 2B is a cross sectional view of the 3D-NAND flash memory which is taken along the line IIB-IIB' shown in FIG. 1.

The NAND flash memory shown in FIG. 1 includes, e.g., a plurality of blocks each being unit of erase. FIG. 1 shows two blocks BK1 and BK2, for example. A source diffusion layer DL is formed in a semiconductor substrate and provided in common for all the blocks. The source diffusion layer DL is connected to a source line SL through a contact plug PS. A multilayer film in which a first and a second film having different dielectric constants are alternately laminated is formed on the source diffusion layer DL. In FIG. 1, the multilayer film has a six-layer structure for convenience of illustration. However, the multilayer film may have several tens to several hundreds of layers, e.g., 36 layers, 128 layers or the like, or may have more layers.

As shown in FIG. 1, five films except an uppermost layer are formed in a plate shape in the blocks BK1 and BK2, and end portions thereof in an X direction form a stepped shape to provide contacts to the respective films. Accordingly, the multilayer film substantially has a pyramid shape. A lowermost layer serves as a source-line side select gate line SGS. The other four films except the lowermost layer and the uppermost layer serve as four word lines WL.

The uppermost layer includes a plurality of conductive lines extending in the X direction. For example, six conductive lines are disposed in a single block BK1. The six (for example) conductive lines forming the uppermost layer serve as bit-line side select gate line SGD.

Further, a plurality of active layers AC for forming a NAND cell unit is formed in columnar shapes in a Z direction (perpendicular to the top surface of the semiconductor substrate) to reach the source diffusion layer DL while penetrating through a plurality of films.

Top portions of the active layers AC are connected to a plurality of bit lines BL extending in a Y direction. The source-line side select gate line SGS is connected to a leader line SGS1 extending in the X direction through a contact plug PSG. The word lines WL are connected to leader lines W1 to W4 extending in the X direction through the contact plugs PW1 to PW4, respectively.

The bit-line side select gate line SGD is connected to leader lines SGD1 extending in the X direction through a contact plug PSD. The bit lines BL, the leader line SGS1, and the leader lines W1 to W4 are made of, e.g. metal.

As shown in FIG. 2A, the source-line side select gate line SGS and the word lines WL1 to WL4 are connected to the leader lines SGS1 and W1 to W4 which are connected to a transistor forming a driver (not shown) through the contact plug PSG and the contact plugs PW1 to PW4.

As shown in FIG. 2B, the active layers AC are formed in the columnar shapes in the Z direction (perpendicular to the top surface of the semiconductor substrate) to reach the source diffusion layer DL while penetrating through the films SGD, WL4, WL3, WL2, WL1 and SGS.

In order to form the active layers AC, it is required to form a deep hole in the laminated film having the films SGS, WL1 to WL4, SGD and the like. The deep hole is formed by forming a patterned mask layer on the laminated film and performing plasma etching while using the mask layer as a mask. In the plasma processing method in accordance with the present embodiment, an etching shape of the deep hole can be improved by controlling processing conditions (a gas type, a gas flow rate ratio, a high frequency power and the like) applied to the case of forming the deep hole by performing the plasma etching on the multilayer film.

(Overall Configuration of the Plasma Processing Apparatus)

Figure 3:
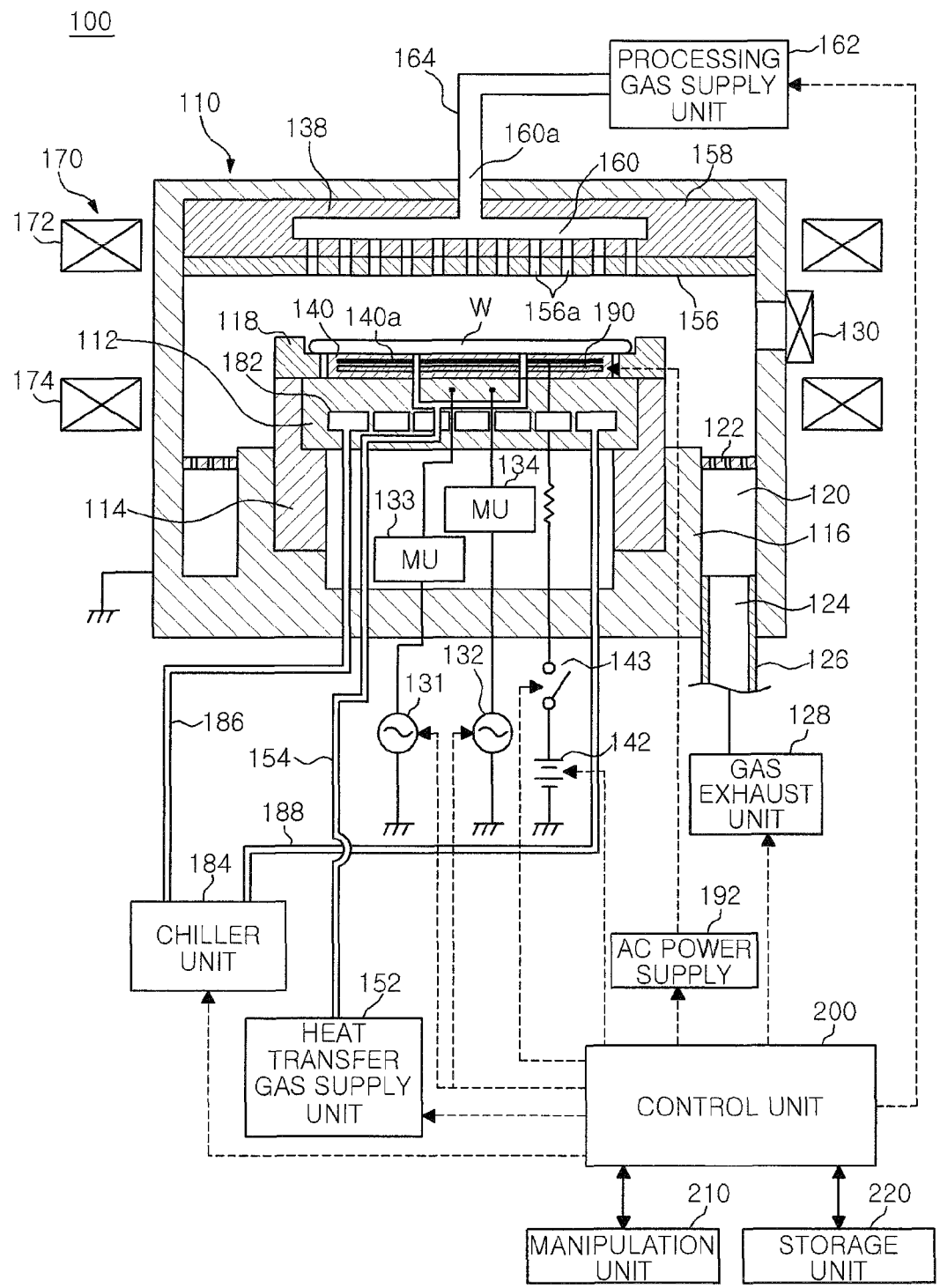
FIG. 3 is a vertical cross sectional view showing a configuration example of a plasma processing apparatus capable of executing the etching process in accordance with the embodiment of the present invention.

Hereinafter, a configuration example of the plasma processing apparatus capable of performing the plasma processing method in accordance with the present embodiment will be described with reference to corresponding drawings. Here, the plasma processing apparatus is, e.g., a parallel plate type (capacitively coupled) plasma etching apparatus including an upper electrode and a lower electrode disposed in parallel to be opposite to each other. FIG. 3 is a vertical cross sectional view showing a schematic configuration of a plasma processing apparatus 100 in accordance with the present embodiment.

As shown in FIG. 3, the plasma processing apparatus 100 includes a cylindrical processing chamber 110 made of aluminum of which surface is, e.g., alumite-treated (anodically oxidized). A case of the processing chamber 110 is grounded.

A mounting table 112 for mounting thereon a semiconductor wafer (hereinafter, referred to as "wafer") W as a substrate to be processed is provided in the processing chamber 110. The mounting table 112 is made of, e.g., aluminum and is supported by a cylindrical supporting portion 116 extending vertically upward from the bottom of the processing chamber 110 via an insulating cylindrical maintaining portion 114. A focus ring 118 made of, e.g., silicon, is provided around an electrostatic chuck 140 on a top surface of the mounting table 112 to improve in-plane uniformity of the etching.

A gas exhaust path 120 is formed between the sidewall of the processing chamber 110 and the cylindrical supporting portion 116. An annular baffle plate 122 is installed at the gas exhaust path 120. A gas exhaust port 124 is provided at a bottom portion of the gas exhaust path 120 and connected to a gas exhaust unit 128 through a gas exhaust pipe 126. The gas exhaust unit 128 has a vacuum pump (not shown). The processing space in the processing chamber 110 is depressurized to a predetermined vacuum degree by the gas exhaust unit 128. Attached to the sidewall of the processing chamber 110 is a gate valve 130 for opening/closing a loading/unloading port of the wafer W.

A first high frequency power supply 131 for plasma generation and a second high frequency (bias) power supply 132 for attracting ions in the plasma are connected to the mounting table 112 via matching units (MUs) 133 and 134, respectively.

The first high frequency power supply 131 applies to the mounting table 112 a first high frequency power having a frequency in a range of 27 MHz to 60 MHz, which is suitable for generation of a plasma in the processing chamber 110. The second high frequency power supply 132 applies to the mounting table 112 a second high frequency power having a relatively low frequency in a range of 380 kHz to 1 MHz which is suitable for attraction of ions in the plasma to the wafer W on the mounting table 112. That is, the mounting table 112 serves as a lower electrode. A shower head 138 to be described later is provided at a ceiling portion of the processing chamber 110 and serves as an upper electrode of a ground potential. Accordingly, the high frequency power from the first high frequency power supply 131 is capacitively applied to a space between the mounting table 112 and the shower head 138.

An electrostatic chuck 140 for attracting and holding the wafer W by electrostatic adsorptive force is provided on the top surface of the mounting table 112. The electrostatic chuck 140 is formed by embedding an electrode 140a made of a conductive film in a pair of films. The electrode 140a is electrically connected to a DC voltage supply 142 via a switch 143. The wafer W is attracted and held on the electrostatic chuck 140 by a Coulomb force generated by a voltage applied from the DC voltage supply 142. A heat transfer gas such as He gas or the like from a heat transfer gas supply unit 152 is supplied to a space between the top surface of the electrostatic chuck 140 and the backside of the wafer W via a gas supply line 154.

The shower head 138 provided at the ceiling portion of the processing chamber 110 includes an electrode plate 156 having a plurality of gas ventholes 156a and an electrode holder 158 for detachably holding the electrode plate 156. A buffer chamber 160 is provided in the electrode holder 158. A processing gas supply unit 162 is connected to a gas inlet port 160a of the buffer chamber 160 through a gas supply line 164. Accordingly, a processing gas supplied from the processing gas supply unit 162 through the gas supply line 164 is introduced into the buffer chamber 160 at the gas inlet port 160a and diffused therein. Then, the processing gas is injected into the processing chamber 110 through the plurality of gas vent-holes 156a.

A magnet 170 extending annularly or concentrically is provided around the processing chamber 110. The magnet 170 includes an upper magnet 172 and a lower magnet 174. The magnet 170 confines a plasma in a plasma generation space between the shower head 138 and the mounting table 112 in the processing chamber 110 by using a magnetic force.

A cooling unit is provided in the mounting table 112. The cooling unit is configured to supply a coolant (e.g., cooling water) of a predetermined temperature from a chiller unit 184 to a coolant line 182 provided in the mounting table 112 through pipes 186 and 188 and circulate the coolant therein. Further, a heater 190 is provided at a lower portion of the electrostatic chuck 140. A desired AC voltage is applied from an AC power supply 192 to the heater 190. With this configuration, the wafer W can be controlled to a desired temperature through the cooling by the chiller unit 184 and the heating by the heater 190. Further, the temperature control is performed based on an instruction from a control unit 200.

The control unit 200 controls the respective units of the plasma processing apparatus 100, e.g., the gas exhaust unit 128, the AC power supply 192, the DC voltage supply 142, the switch 143 for the electrostatic chuck, the first high frequency power supply 131, the second high frequency power supply 132, the matching units 133 and 134, the heat transfer gas supply unit 152, the processing gas supply unit 162, the chiller unit 184 and the like. Moreover, the control unit 200 is connected to a host computer (not shown).

The control unit 200 is connected to a manipulation unit 210 including a keyboard through which an operator inputs commands for management, a display for visually displaying operational states, or the like. The control unit 200 is also connected to a storage unit 220 that stores a program for performing an etching process of the wafer W, processing conditions (recipes) required for executing the program, or the like.

The processing conditions include a plurality of parameter values such as control parameters for controlling the respective units, setting parameters and the like. The parameter values of the processing conditions are, e.g., a flow rate ratio in the processing gas, a pressure in the processing chamber, a high frequency power and the like. In the case of performing etching (e.g., main etching, over etching or the like) multiple times as in the plasma processing in accordance with the present embodiment which will be described later, the processing conditions for the respective etching steps may be separately stored.

Such programs or processing conditions may be stored in a hard disk or a semiconductor memory, or may be set in a predetermined position of the storage unit 220 while being stored in a computer-readable storage medium such as a CD-ROM, a DVD or the like that can be read out by a portable computer. The function of the control unit 200 may be realized by software, by hardware, or by both of the software and the hardware.

(Operation of the Plasma Processing Apparatus)

Hereinafter, an operation of the plasma processing apparatus 100 configured as described above will be described. In the plasma processing apparatus 100, in order to perform plasma-etching on the wafer W, first, the gate valve 130 is open and the wafer W held on a transfer arm is loaded into the processing chamber 110. The wafer W is supported by lift pins (lifer pins) (not shown) and mounted on the electrostatic chuck 140 by downward movement of the lift pins. After the wafer W is loaded, the gate valve 130 is closed and a processing gas is introduced into the processing chamber 110 from the processing gas supply unit 162 at a predetermined flow rate and a predetermined flow rate ratio. Then, a pressure in the processing chamber 110 is decreased to a set value by the gas exhaust unit 128.

A high frequency power for plasma generation is supplied at a predetermined power level from the first high frequency power supply 131 to the mounting table 112, and a high frequency bias power is supplied at a predetermined power level from the second high frequency power supply 132 to the mounting table 112. Further, a voltage from the DC voltage supply 142 is applied to the electrode 140a of the electrostatic chuck 140 to hold the wafer W on the electrostatic chuck 140. He gas as a heat transfer gas is supplied from the heat transfer gas supply unit 152 to the space between the top surface of the electrostatic chuck 140 and the backside of the wafer W.

In this state, when the processing gas is introduced from the shower head 138, the processing gas is turned into a plasma by the high frequency power applied from the first high frequency power supply 131. In this manner, the plasma is generated in the plasma generation space between the upper electrode (the shower head 138) and the lower electrode (the mounting table 112). The multilayer film or the like formed on the surface of the wafer W is etched by the plasma thus generated. Further, ions in the plasma can be attracted onto the wafer W by the high frequency power from the second high frequency power supply 132.

When the etching is completed, the wafer W is separated from the mounting table 112 by lifting the lift pins upward. The gate valve 130 is open and the wafer W supported by the lift pins is unloaded by a transfer arm (not shown) which is loaded through the gate valve 130. Then, a next wafer W is loaded into the processing chamber 110 by the transfer arm and subjected to etching therein. By repeating such processes, a plurality of wafers W is processed consecutively.

(Film to be Etched)

Figure 4:
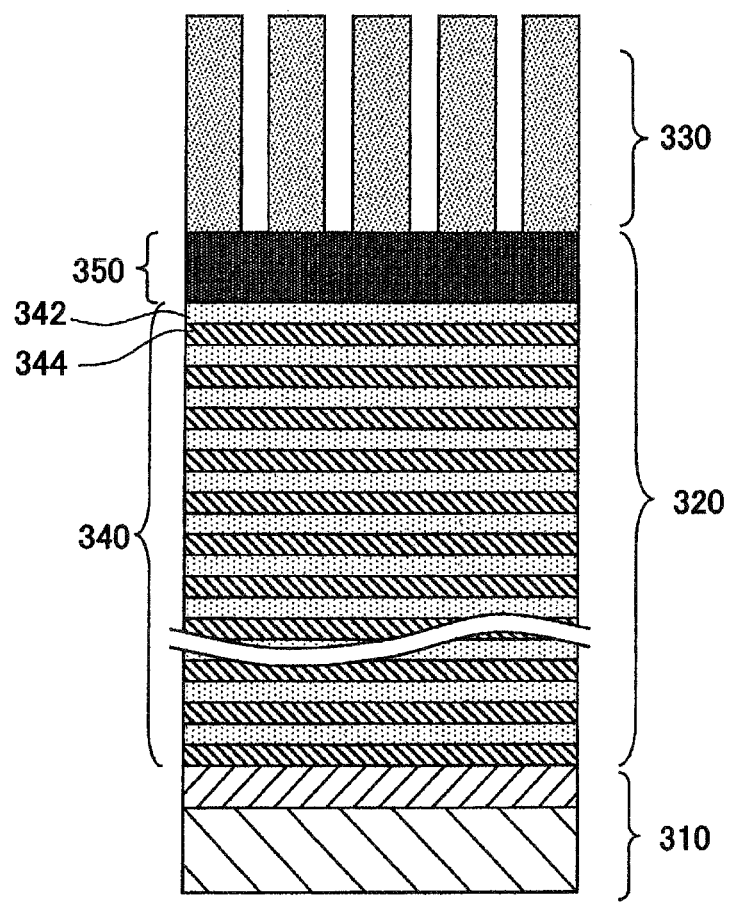
FIG. 4 is a cross sectional view for explaining a structure of the multilayer film in accordance with the embodiment of the present invention.

Next, a film structure of a film to be etched by the plasma processing in accordance with the present embodiment will be described with reference to corresponding drawings. Here, a multilayer film formed on the wafer W will be described as an example of the film to be etched. By plasma-etching the multilayer film, a plurality of deep recesses (holes or trenches) is formed in the multilayer film. FIG. 4 is a cross sectional view showing a film structure of the multilayer film as the film to be etched.

A film structure shown in FIG. 4 includes a multilayer film 320 formed on a base layer 310 and a mask layer 330 formed on the multilayer film 320. Here, the multilayer film 320 has a laminated film 340 in which two different types of films (first film 342 and second film 344) are alternately laminated multiple times. The laminated film 340 has, e.g., 36 layers. The number of layers in the laminated film 340 is not limited thereto, and several tens of layers or more than hundred layers may be laminated.

The first film 342 and the second film 344 have different dielectric constants. In the present embodiment, a silicon oxide film ($SiO_2$ film) is used as the first film 342 and a polysilicon film (doped with impurities) is used as the second film 344, which have different dielectric constants.

The types of the first film 342 and the second film 344 are not limited thereto. For example, the film types of the first film 342 and the second film 344 may be the opposite to the above. That is, a silicon oxide film may, be used as the second film 344 and a polysilicon film (doped with impurities) may be used as the first film 342.

The combination of film types of the first film 342 and the second film 344 is not limited to the combination of a silicon oxide film ($SiO_2$ film) and a polysilicon film (doped with impurities) and other film types may be combined. For example, a polysilicon film may have different dielectric constants depending on whether or not it is doped with impurities, so that a combination of a polysilicon film without impurity doping and a polysilicon film with impurity doping may be employed for the combination of the first film 342 and the second film 344. Further, boron, e.g., may be doped as impurities.

In addition, the combination of a silicon oxide film ($SiO_2$ film) and a silicon nitride film (SiN film) or the combination of a silicon oxide film ($SiO_2$ film) and a polysilicon film (not doped with impurities) may be employed for the combination of the first film 342 and the second film 344.

The mask layer 330 is a photoresist layer having a plurality of patterned openings for forming a plurality of recesses in the multilayer film 320. The mask layer 330 may be made of an organic film, an amorphous carbon film or the like. The mask layer 330 may be an i-ray (wavelength of 365 nm) photoresist layer.

In this multilayer film 320, another film may be formed on the laminated film 340. Here, a SiN layer (silicon nitride layer) 350 is formed, as an underlying film of the mask layer 330, on the laminated film 340. For example, when the mask layer 330 is formed on the multilayer film 320, CMP (Chemical Mechanical Polishing) for planarizing the surface of the mask layer 330 may be performed chemically and mechanically. Here, the SiN layer is formed on the laminated film 340, as a stopper layer of the CMP.

In the multilayer film 320 having the SiN layer 350 and the like on the laminated film 340, when the plasma etching process starts, the SiN layer 350 exposed in the openings of the mask layer 330 is etched first and, then, the laminated film 340 formed therebelow is etched. As a consequence, recesses penetrating through the SiN layer 350 and the laminated film 340 are formed.

In this case, however, as the etching proceeds in the depth direction of the laminated film 340, the SiN layer 350 may be etched in a width direction of the recess as well as in the depth direction of the laminated film 340. In other words, the width of the sidewall of the SiN layer exposed to the recess is gradually increased in the depth direction, and an abnormal etching shape such as bowing occurs through the SiN layer 350 and the laminated film 340 formed therebelow.

Figure 5A:
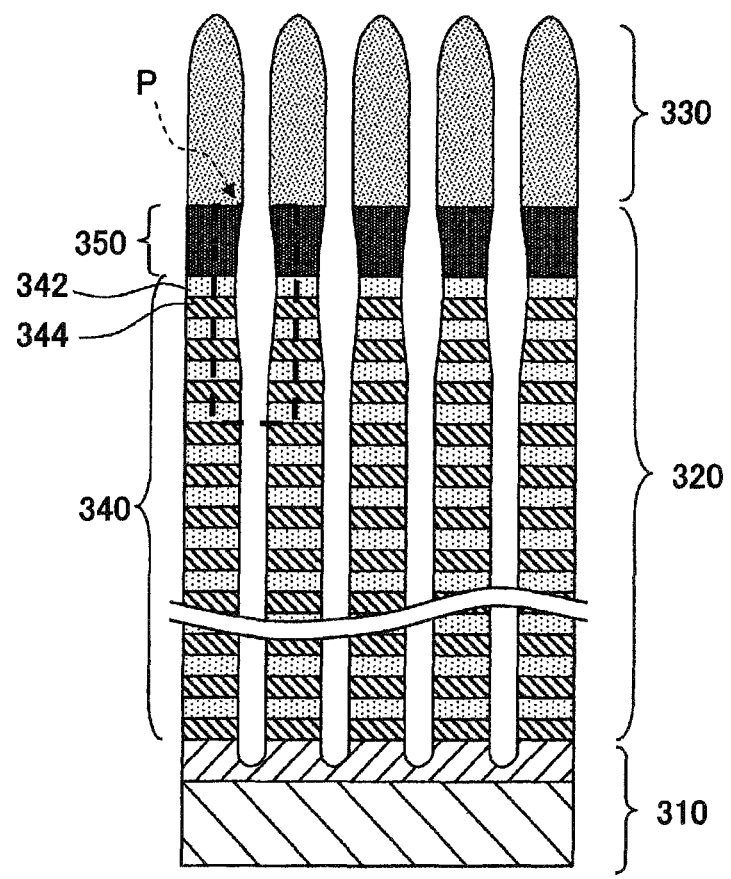
FIG. 5A is a cross sectional view schematically showing the case where an abnormal etching shape (bowing) occurs when a multilayer film including a SiN layer shown in FIG. 4 is etched.
Figure 5B:
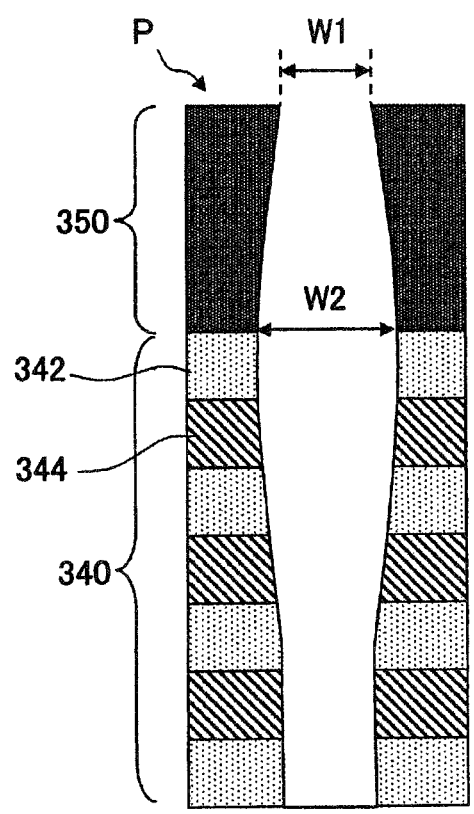
FIG. 5B is an enlarged cross sectional view showing a part P of a recess shown in FIG. 5A.
Figure 7A:
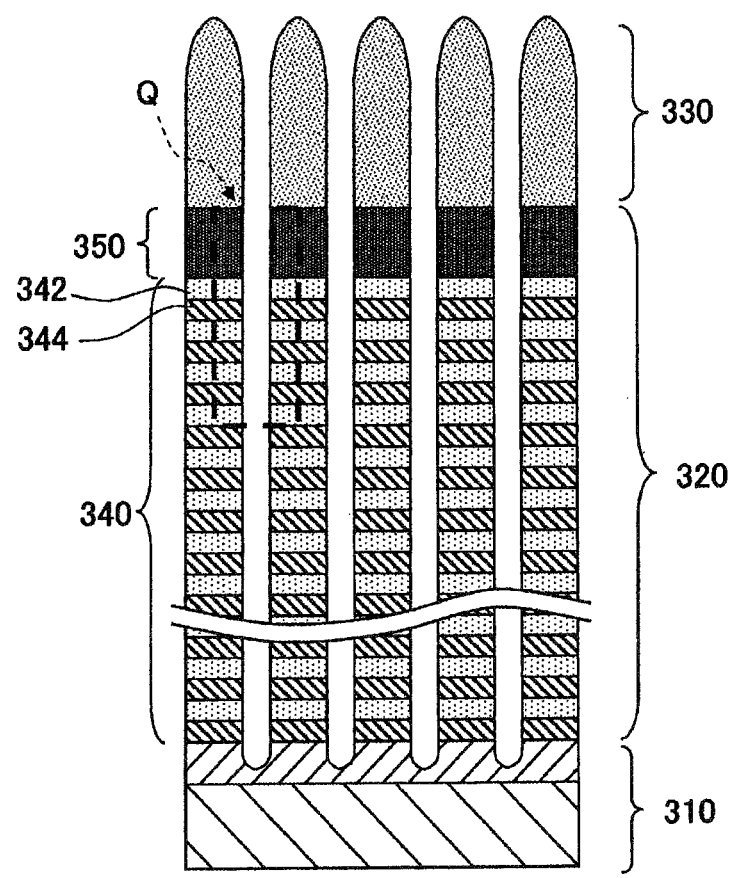
FIG. 7A is a cross sectional view schematically showing the case where the occurrence of the abnormal etching shape (bowing) is suppressed when the multilayer film including the SiN layer shown in FIG. 4 is etched.
Figure 7B:
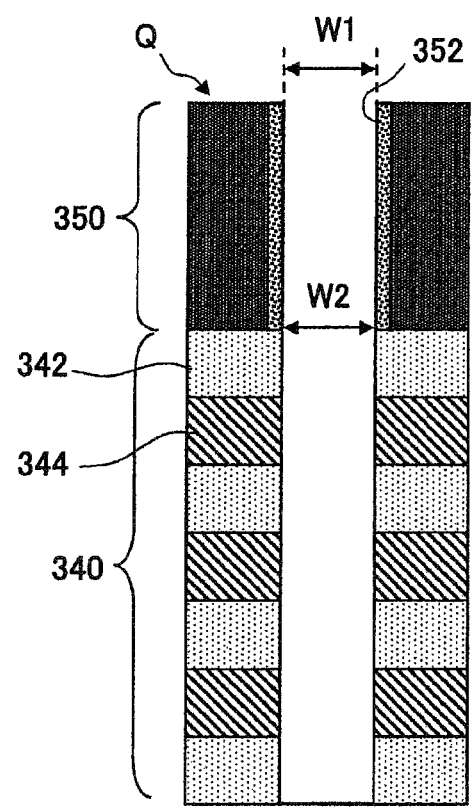
FIG. 7B is an enlarged cross sectional view showing a part Q of a recess shown in FIG. 7A.

Hereinafter, an etching shape obtained by etching the multilayer film 320 having the SiN layer 350 on the laminated film 340 will be described in detail with reference to corresponding drawings. FIG. 5A is a cross sectional view schematically showing the case where an abnormal etching shape (bowing) occurs when the multilayer film having the SiN layer 350 shown in FIG. 4 is etched. FIG. 5B is an enlarged view of a part P of the recess. FIG. 7A is a cross sectional view schematically showing the case where the occurrence of the abnormal etching shape (bowing) is suppressed when the multilayer film having the SiN layer 350 shown in FIG. 4 is etched. FIG. 7B is an enlarged view of a part Q of the recess.

In the case of etching the multilayer film 320 in which two types of the first film 342 and the second film 344 shown in FIG. 4 are alternately laminated, a processing gas containing gases for etching the respective films 342 and 344 is used. For example, when the first film 342 is a silicon oxide film and the second film 344 is a polysilicon film (doped with impurities), a gaseous mixture of fluorocarbon-based gas (e.g., $C_4F_8$ gas) for etching the silicon oxide film as the first film 342 and bromine-containing gas (e.g., HBr gas) for etching the polysilicon film (doped with impurities) as the second film 344 is used as the processing gas.

The SiN layer 350 may also be etched by the processing gas for etching the films 342 and 344 forming the laminated film 340. For that reason, the etching is firstly performed in the depth direction of the SiN layer 350 exposed in the openings of the mask layer 330 and then in the depth direction of the laminated film 340.

However, the SiN layer 350 is easily etched in the width direction as well as in the depth direction compared to the silicon oxide film and the polysilicon film (doped with impurities) forming the laminated film 340. Therefore, as the etching proceeds in the depth direction, the sidewall of the SiN layer 350 is gradually etched. Accordingly, an opening width W2 of a bottom surface of the SiN layer 350 becomes greater than an opening width W1 of the surface of the SiN layer 350, as shown in FIG. 5B. Since the SiN layer 350 is an uppermost layer, it is exposed to the plasma for a relatively long period of time compared to the laminated film 340. As a result, an abnormal shape such as bowing easily occurs through the SiN layer 350 and the laminated film 340 disposed therebelow.

Therefore, the present inventors have executed various tests and found that the occurrence of bowing can be suppressed by performing plasma etching using a gas which is different from the processing gas for etching the laminated film 340 in addition to the processing gas. However, if the occurrence of bowing is suppressed, the etching in the depth direction of the multilayer film may also be suppressed and, thus, it is difficult to form a recess having a desired depth.

Hence, as for an additional gas, it is preferable to use a gas for suppressing the occurrence of bowing without suppressing the etching in the depth direction of the multilayer film 320. In view of the above, a test for etching the multilayer film 320 by using a processing gas added with different types of gases was executed. As a result, it was found that $BCl_3$ gas is most effective as the additional gas.

Figure 6:
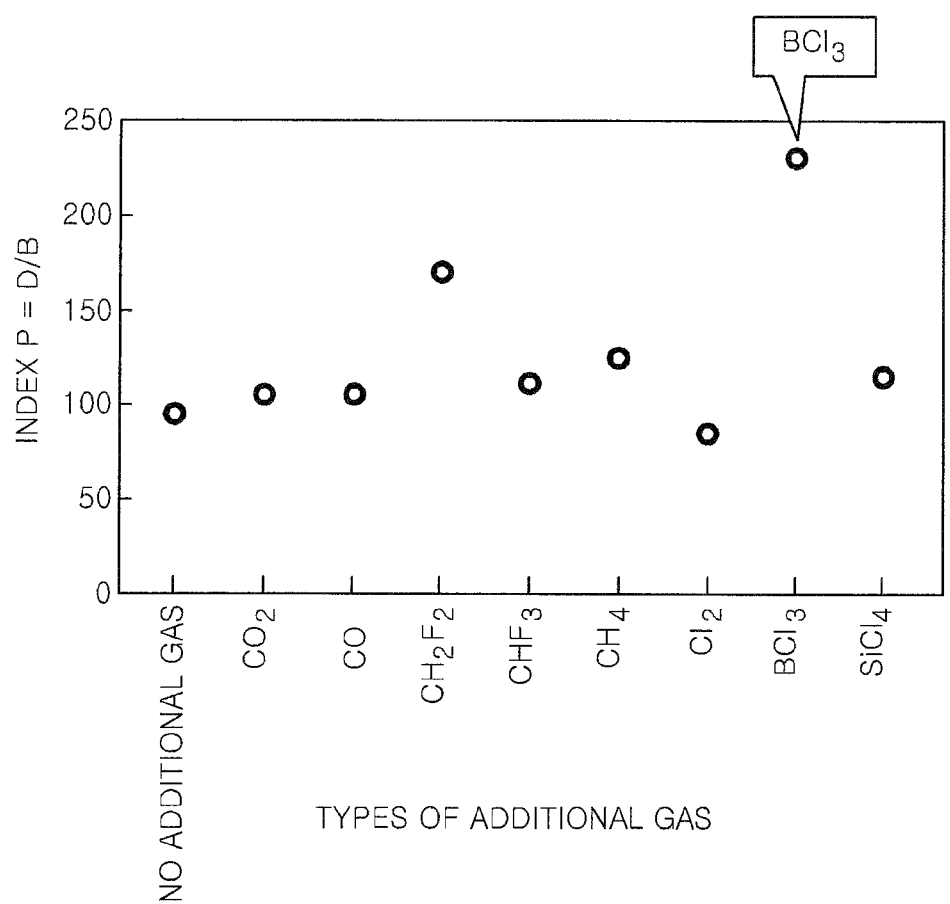
FIG. 6 shows relationship between types of additional gases and an etching shape.

Hereinafter, the result of the tests for etching the multilayer film 320 while varying types of gases added to the processing gas will be described with reference to corresponding drawings. FIG. 6 shows relationship between types of additional gases and an etching shape. Here, a depth D/bowing ratio B is used as an index P of the etching shape. The bowing ratio B is a difference between a CD (Critical Dimension) value corresponding to an opening width of the top surface of the SiN layer 350 and that corresponding to an opening width of the bottom surface of the SiN layer 350. Therefore, when the bowing ratio B is zero, the bowing does not occur. As the bowing ratio B becomes close to zero, the occurrence of the bowing is suppressed. Further, as the depth D is increased, the etching in the depth direction is not suppressed.

As described above, a gas suitable for the additional gas can suppress the occurrence of bowing without suppressing the etching in the depth direction. Therefore, it is considered that a gas that ensures a higher index P of the etching shape is preferable as the additional gas.

According to the test result shown in FIG. 6, in the case of using $CO_2$ gas, CO gas, $CHF_3$ gas, $CH_4$ gas, or $SiCl_4$ gas as the additional gas, the index P of the etching shape is about 100 which is substantially the same as the case of not adding the additional gas. In the case of using $Cl_2$, the index P is slightly decreased. Meanwhile, in the case of using $CH_2F_2$ gas or $BCl_3$ gas as the additional gas, the index P of the etching shape is increased compared to the cases of using other gases. Especially, in the case of using $BCl_3$ gas, the index P is considerably high, e.g., about 2.5 times higher than that in the case of using $CO_2$ gas, CO gas or the like.

According to the test result, in the etching of the multilayer film 320 having the SiN layer 350 between the laminated film 340 and the mask layer 330, the effect of performing the etching in the depth direction of the multilayer film 320 while suppressing the occurrence of bowing is increased by adding $BCl_3$ gas as an additional gas for forming a protective film on the SiN layer 350 to the processing gas (including e.g., $C_4F_8$ gas, HBr gas or the like) for etching the laminated film 340.

In the case of adding $BCl_3$ to the processing gas (including e.g., $C_4F_8$ gas, HBr gas or the like), the sidewall of the SiN layer 350 is not etched and the etching proceeds in the depth direction as shown in FIG. 7A. Therefore, the opening width W1 of the top surface of the SiN layer 350 and the opening width W2 of the bottom surface thereof become substantially the same as shown in FIG. 7B, and the occurrence of bowing is suppressed. This is because when $BCl_3$ gas is added, a protective film (boron nitride BN in this example) 352 is formed on the sidewall of the SiN layer 350 during the etching of the laminated film 340 as shown in FIG. 7B and the progress of the etching toward the sidewall of the SiN layer 350 is suppressed by the protective film 352. As for the additional gas for forming the protective film 352 of the SiN layer 350, boron-containing gas may be used other than $BCl_3$ gas. The boron-containing gas other than boron trichloride gas ($BCl_3$ gas) may be boron trifluoride gas ($BF_3$ gas), boron oxide gas ($B_2O_3$ gas) or the like.

In the plasma etching process in accordance with the present embodiment, even when the mask underlying film such as the SiN layer 350 is formed on the laminated film 340 forming the multilayer film 320, a good etching shape can be obtained while suppressing an abnormal etching shape such as bowing by adding $BCl_3$ gas as the additional gas for forming the protective film 352 of the SiN layer 350 to the processing gas for etching the laminated film 340.

(Etching of Multilayer Film)

Hereinafter, the plasma etching process in accordance with the present embodiment will be described with reference to corresponding drawings. Here, a plasma etching process for forming deep holes penetrating through the multilayer film to form a plurality of active layers AC in the multilayer film shown in FIG. 1 will be described as an example. The multilayer film includes a base film 310 (etching stop layer), a laminated film 340 in which a first film 342 and a second film 344 are alternately laminated, a SiN layer 350 formed on the laminated film 340, and a mask layer 330 formed on the SiN layer 350 and having patterned openings as shown in FIG. 8A.

Figure 8A:
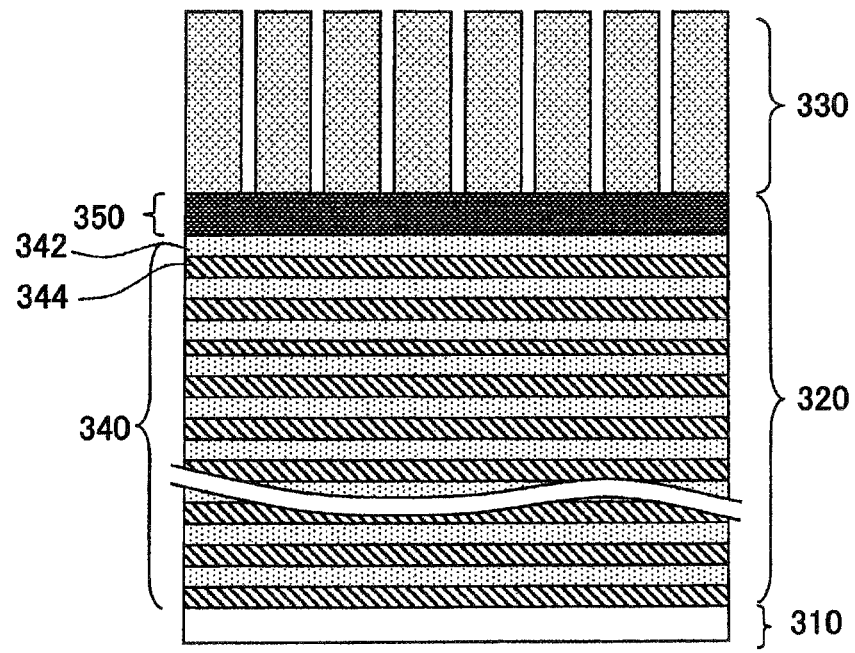
FIG. 8A is a flow diagram of the etching process in accordance with the embodiment of the present invention which is a cross sectional view for explaining the multilayer film before the etching process in accordance with the embodiment of the present invention.
Figure 8B:
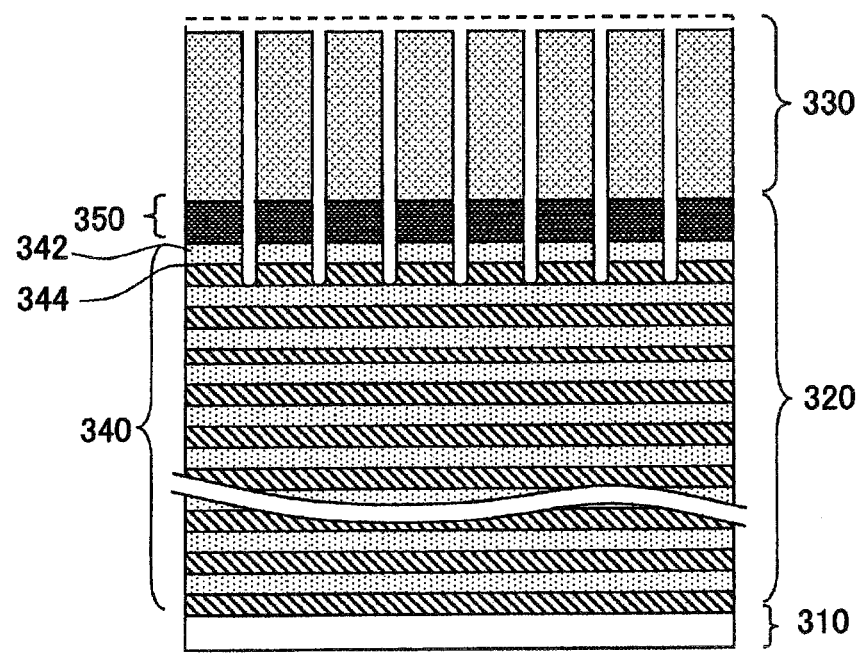
FIG. 8B is a flow diagram continued from FIG. 8A which is a cross sectional view for explaining a state after a first main etching.
Figure 8C:
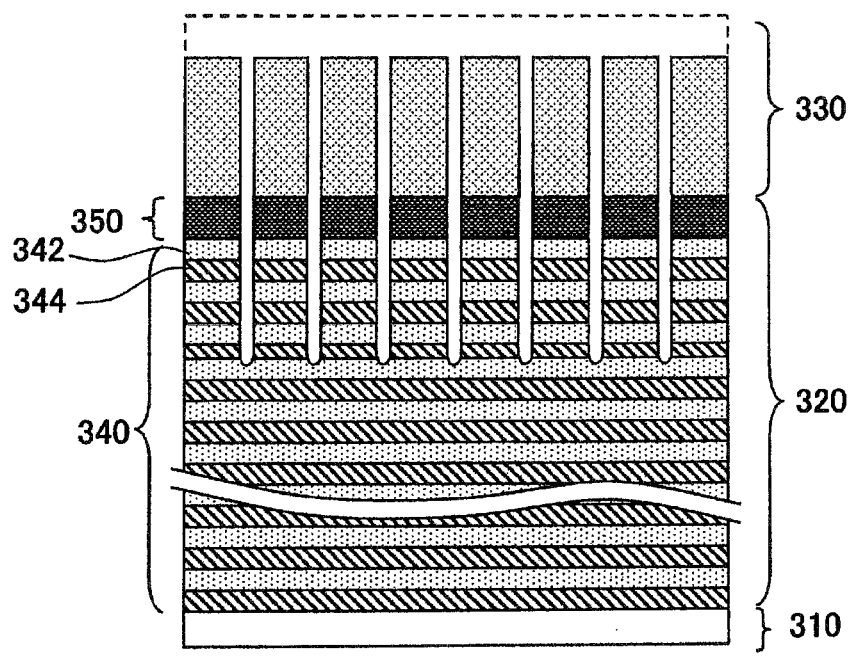
FIG. 8C is a flow diagram continued from FIG. 8B which is a cross sectional view for explaining a state after a second main etching.
Figure 8D:
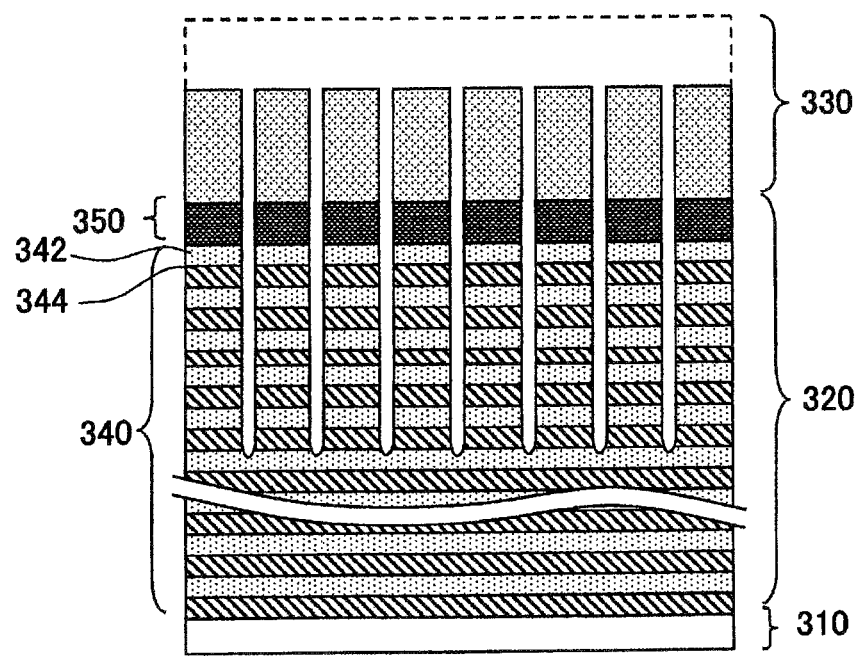
FIG. 8D is a flow diagram continued from FIG. 8C which is a cross sectional view for explaining a state after a third main etching.
Figure 8E:
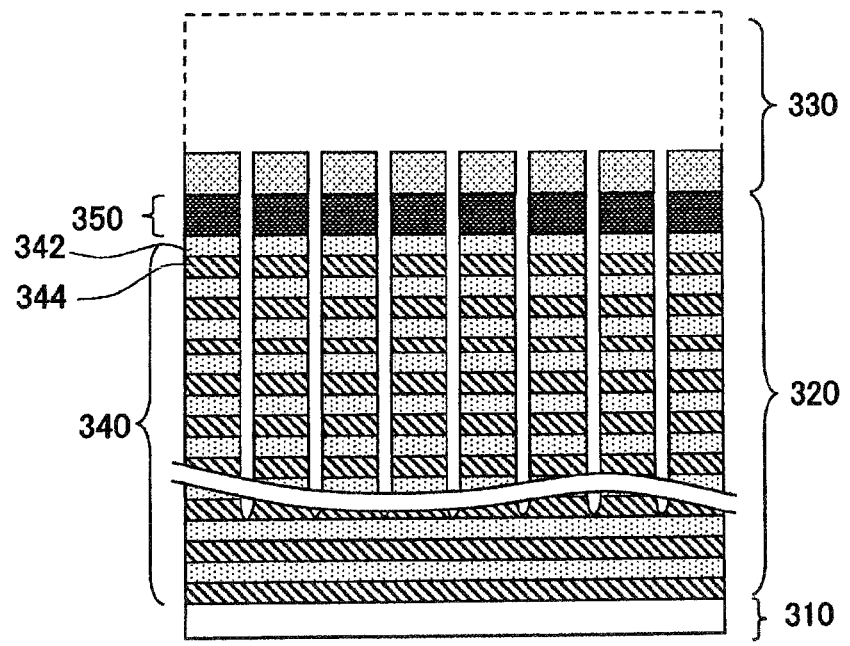
FIG. 8E is a flow diagram continued from FIG. 8D which is a cross sectional view for explaining a state after a fourth main etching.
Figure 8F:
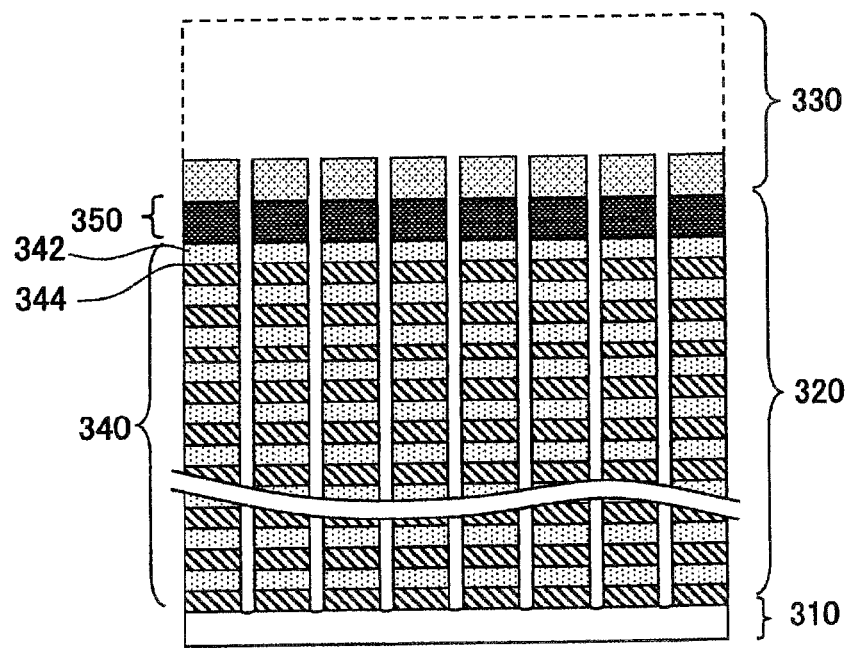
FIG. 8F is a flow diagram continued from FIG. 8E which is a cross sectional view for explaining a state after over etching.

In the plasma etching process in accordance with the present embodiment, the deep holes are formed in a desired pattern in the multilayer film 320 shown in FIG. 8A by performing etching multiple times. Here, four main etching steps ME1 to ME4 are executed for forming holes mainly in a depth direction. Then, an over etching step OE is executed to increase the bottom CD of bottom portion of each hole and control a shape of the bottom portion to be good while suppressing etching in the depth direction to prevent the base film 310 from being penetrated. FIGS. 8A to 8F are process diagrams of the plasma etching process for the multilayer film in accordance with the present embodiment. FIGS. 8B to 8E show the main etching steps ME1 to ME4, and FIG. 8F shows the over etching step OE. In the respective process diagrams, the illustration of the protective film formed on the sidewall of the SiN film by adding $BCl_3$ gas is omitted.

Here, the main etching steps are executed four times, for example. However, the execution number of the main etching steps is not limited to the above and may be about two, three or more than five. As the depth of the hole formed in the laminated film 340 is increased, the execution number of the main etching steps may be increased.

The processing gas used in the main etching steps ME1 to ME4 is obtained by additionally adding $BCl_3$ gas as the additional gas for forming the protective film of the SiN layer 350 to HBr gas and $C_4F_8$ gas for etching the first film 342 and the second film 344. Further, the processing gas may contain Ar gas. $C_4F_8$ gas is the processing gas for etching the silicon oxide film as the first film 342. HBr gas is the processing gas for etching the polysilicon film (doped with impurities) as the second film 344. The flow rate ratio in the processing gas is, e.g., $HBr/C_4F_8/BCl_3/Ar$=496 sccm/41 sccm/50 sccm/100 sccm.

Other processing conditions applied to the etching executed in the above plasma processing apparatus 100 are as follows.

Pressure in the processing chamber 110: about 50 mTorr (6.6661 Pa)

First high frequency power from the first high frequency power supply 131: about 2000 W (283.1 W/cm$^2$)

Second high frequency power from the second high frequency power supply 132: about 4000 W (566.2 W/cm$^2$)

Magnetic force of the magnet 170: about 454 Gauss

In the main etching ME, the multilayer film 320 (SiN layer 350 and the laminated film 340) is etched in the order of the steps ME1→ME2→ME3→ME4 as shown in FIGS. 8B to 8E. At this time, since $BCl_3$ gas is added as the additional gas to the processing gas, the protective film 352 shown in FIG. 7B is formed on the sidewall of the SiN film 350 exposed to the recess (hole in this example) as described above. Therefore, the etching can proceed in the depth direction while suppressing the occurrence of bowing. As a result, a plurality of deep holes can be formed in the laminated film 340 without an abnormal shape such as bowing.

(Flow Rate Ratio of $BCl_3$ Gas as Additional Gas)

Hereinafter, an optimal flow rate ratio of $BCl_3$ gas will be obtained. Here, etching tests were performed while varying a flow rate of $BCl_3$ gas to about 50 sccm, 75 sccm, 100 sccm and 200 sccm with respect to a flow rate of HBr gas fixed to 500 sccm. As a result, it has been found that the effect of suppressing the occurrence of a bowing shape is small when the flow rate of $BCl_3$ gas is about 50 sccm (10% with respect to HBr gas). When the flow rate of $BCl_3$ gas is about 200 sccm (40% with respect to HBr gas), an etching rate at the bottom portion of the hole was decreased, which makes the bottom CD of the bottom portion considerably small. Therefore, in an initial main etching step ME1, it is preferable to determine the flow rate ratio of $BCl_3$ gas with respect to HBr gas to be at least in a range of 10% to 40%.

Further, the flow rate ratio of $BCl_3$ gas in each of the main etching steps may be constant or may be gradually decreased. For example, the flow rate ratio of $BCl_3$ gas in the main etching steps ME1 to ME4 may be set to about 75 sccm, 50 sccm, 25 sccm and 0 sccm, respectively. Accordingly, a thickness of the protective film 352 formed on the sidewall of the SiN layer 350 can be controlled. In other words, as the hole becomes deeper by the repeated execution of the main etching steps, the flow rate ratio of $BCl_3$ gas is decreased to prevent excessive increase in the thickness of the protective film. Hence, the etching can easily proceed in the depth direction.

(Flow Rate Ratio of $C_4F_8$ Gas as Processing Gas)

The flow rate ratio of $C_4F_8$ gas in the main etching steps ME1 to ME4 may also be gradually decreased. For example, the flow rate ratio of $C_4F_8$ gas in the main etching steps ME1 to ME4 may be set to about 44 sccm, 40 sccm, 36 sccm, and 32 sccm, respectively.

$C_4F_8$ gas forming the processing gas used in the main etching steps ME1 to ME4 contains carbon. When the amount of carbon is large, it is deposited on the wall of the hole formed in the laminated film 340. Thus, the etching is disturbed as the execution number thereof is increased. As a consequence, the hole becomes thin. Especially, the hole becomes narrow at the bottom portion, so that the bottom CD becomes smaller than a specific value. The deposition amount of carbon can be gradually decreased by decreasing the flow rate of $C_4F_8$ gas as the execution number of the main etching steps is increased, as described above. Accordingly, the bottom CD can be ensured. The bottom CD may be measured at the lowermost layer of the laminated film 340 or at a layer higher than the lowermost layer of the laminated film 340 by several layers.

The present embodiment has described the example in which HBr gas as a bromine-containing gas is used as the processing gas for etching the polysilicon film (doped with impurities) as the second film 344. However, the processing gas is not limited thereto and may be a bromine-containing gas other than HBr gas. Further, instead of the bromine-containing gas, a gas composed of at least one of chlorine-containing gas and iodine-containing gas may be used, for example.

Moreover, in the present embodiment, $C_4F_8$ gas as a fluorocarbon-based gas (CF-based gas) is used as the processing gas for etching the silicon oxide film as the first film 342. However, the processing gas is not limited thereto and may be a fluorocarbon-based gas (CF-based gas) other than $C_4F_8$ gas.

In addition, $SF_6$ gas (sulfur hexafluoride) or COS gas (carbonyl sulfide) may be further added to the processing gas used in the main etching steps ME1 to ME4. By adding $SF_6$ gas or COS gas to the processing gas used in the main etching steps ME1 to ME4, sulfide deposits serve as a protective film especially for the polysilicon film (doped with impurities) as the second film 344. Therefore, it is possible to suppress generation of irregularities at the opening formed in the laminated film 340 due to relatively high etching rate of the polysilicon film with respect to the silicon oxide film as the first film 342.

Further, the addition amount (gas flow rate) of $SF_6$ gas is preferably in a range of 20 sccm to 100 sccm. The addition amount (gas flow rate) of COS gas is also preferably in the range from 20 sccm to 100 sccm. The flow rate ratio of $SF_6$ gas or COS gas in the main etching steps ME1 to ME4 may be gradually increased. For example, the flow rate ratio of $SF_6$ gas in the main etching steps ME1 to ME4 may be set to about 0 sccm, 25 sccm, 50 sccm, and 100 sccm, respectively.

The second high frequency power in the main etching steps ME1 to ME4 in accordance with the present embodiment may be gradually increased. In that case, the second high frequency power may be adjusted after every main etching step or after several main etching steps. For example, the second high frequency power may be set to about 3000 W in the main etching steps ME1 and ME2 and may be increased to about 4000 W in the main etching steps ME3 and ME4. Accordingly, as the depth of the hole is increased by the repeated execution of the etching, ions in the plasma are strongly attracted and, thus, the etching in the depth direction can be facilitated.

The decrease in the thickness of the mask layer 330 can be suppressed by setting the temperature of the wafer W having the multilayer film to a slightly high level in the main etching steps ME1 to ME4 and the over etching step OE. For example, the temperature of the mounting table 112 is controlled such that the temperature of the wafer W becomes at least in a range of 150° C. to 200° C.

When the main etching steps ME1 to ME4 are completed, the over etching step OE is executed. In the over etching step OE, the bottom CD of the bottom portion of the opening is increased while suppressing the etching in the depth direction to prevent the base film from being etched. Therefore, the first high frequency power/the second high frequency power is decreased to about 1500 W/1000 W (212.3 W/cm$^2$/141.5 W/cm$^2$) to minimize the etching of the base film. Accordingly, in the processing gas used in the over etching step OE, the flow rate of HBr gas may be decreased or $C_4F_8$ gas may be changed into $CH_4$ gas that is a deposition gas.

The powers from the first and the second high frequency power supplies 131 and 132 in the over etching step OE are set to be smaller than those in each of the main etching steps ME1 to ME4. In the over etching step OE, the second high frequency power that is a high frequency bias power is decreased from about 4500 W to about 1000 W because the bottom CD of the bottom portion of the hole needs to be increased and isotropic etching is required. Further, the second high frequency power is decreased to about 1000 W to protect the base film. In addition, in the over etching step OE, $NF_3$ gas and $CH_4$ gas may be supplied as an etching gas for horizontal etching to increase the bottom CD.

Moreover, in the over etching step OE, the second high frequency power may be pulse-modulated to be applied in a pulse form. As a consequence, the bottom CD can be increased.

This will be described in detail hereinafter. If the high frequency power is applied in a continuous waveform and positive ions are constantly inserted into the hole, the bottom portion of the hole is positively charged. If positive ions are further inserted into the hole in that state, the positive ions are repelled from the positive charges charged in the bottom portion of the hole. Since, therefore, it is not easy to insert the ions into the bottom portion of the hole, the etching does not easily proceed at the bottom portion of the hole.

To that end, the high frequency bias power is pulse-modulated at a high speed to be applied in a pulse form. Hence, the positive charges charged in the bottom portion of the hole during the application of the high frequency power are discharged from the bottom portion of the hole during the non-application of the high frequency power. In other words, the number of positive charges accumulated in the bottom portion of the hole can be reduced by applying the high frequency power in a pulse form. Accordingly, the repulsion between the positive charges and the positive ions is suppressed, which makes it easy to insert the positive ions into the bottom portion of the hole. As a result, the etching at the bottom portion of the hole is facilitated and the bottom CD can be increased.

In the present embodiment, a continuous waveform of the high frequency bias power is converted into a pulse form by pulse modulation in the over etching step OE. However, the high frequency bias power may be pulse-modulated and applied in a pulse form during the entire processes of the main etching steps ME1 to ME4 and the over etching step OE. Or, the high frequency bias power may be pulse-modulated and applied in a pulse form from a certain main etching step ME to the over etching step OE. However, in order to effectively increase the bottom CD, it is preferable to pulse-modulate and apply the high frequency power in a pulse form at least during the over etching step OE.

In the present embodiment, the high frequency bias power having a duty cycle of pulse modulation ranging from 50% to 70% and a frequency of about 2 kHz was applied to the lower electrode. In this case, characteristics were considerably improved compared to the case of applying the high frequency power having a frequency of about 2 kHz in a continuous waveform. Therefore, in the high frequency power applied from the second high frequency power supply 132 to the lower electrode, the duty cycle is preferably within a range from 50% to 70% and more preferably within a range from 20% to 80%. Further, the pulse modulation at a frequency ranging from 0.2 kHz to 10 kHz is preferable.

(Etching by Plasma Processing Apparatus)

Hereinafter, an operation of a control unit 200 in the case of etching the multilayer film by the plasma processing apparatus 100 shown in FIG. 3 will be described with reference to corresponding drawings. Here, the wafer W having the multilayer film 320 shown in FIG. 4A is etched. As described above, the multilayer film 320 has the SiN layer 350 between the laminated film 340 and the mask layer 330. Therefore, by adding the additional gas (e.g., $BCl_3$ gas) for forming the protective film of the SiN layer 350 to the processing gas, the etching can proceed while suppressing the occurrence of an abnormal etching shape (e.g., bowing).

Figure 9:
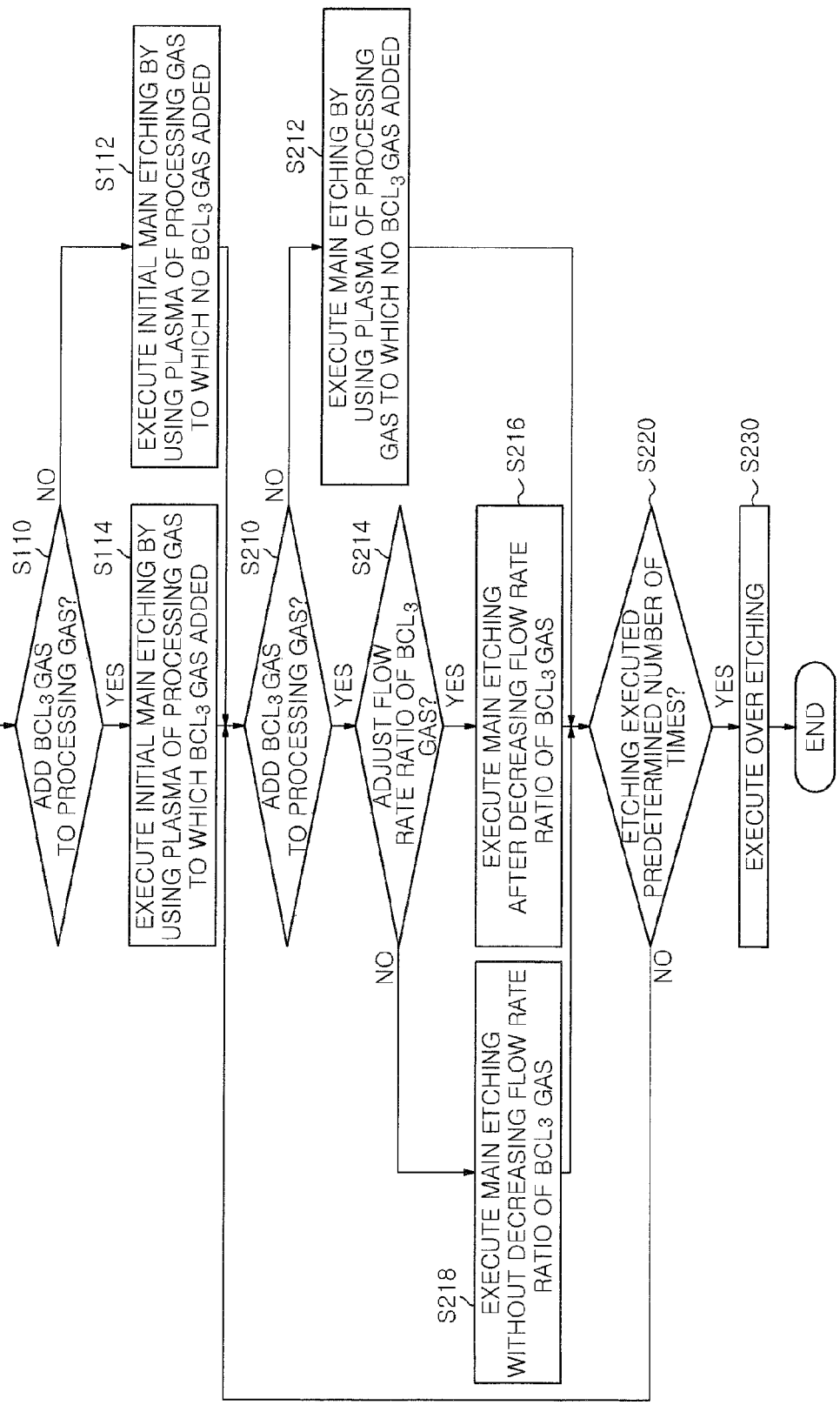
FIG. 9 is a flowchart schematically showing the etching process in accordance with the embodiment of the present invention.

In the specific example of the plasma etching process described in FIGS. 8A to 8F, $BCl_3$ gas is added to the processing gas used in all the four main etching steps ME1 to ME4. However, hereinafter, a specific example of the plasma etching process in which the timing of adding $BCl_3$ gas or the flow rate ratio of $BCl_3$ gas is controlled will be described. FIG. 9 is a flowchart showing an outline of the plasma etching process in accordance with the present embodiment. Hereinafter, the case of adding $BCl_3$ gas as the additional gas for forming the protective film of the SiN layer 350 will be described as an example. Further, different processing gases are used depending on types of the first and the second film 342 and 344 forming the laminated film 340. As described above, when the first film 342 is a silicon oxide film and the second film 344 is a polysilicon film (doped with impurities), HBr gas and $C_4F_8$ gas are used as the etching gas, for example.

In the plasma etching process shown in FIG. 9, the initial (first) main etching is executed in steps S110 to S114 and the second and following main etching are executed in the steps S210 to S220 a predetermined number of times. Finally, the over etching is executed in the step S230.

When the wafer W having the multilayer film 320 shown in FIG. 8A is loaded into the plasma processing apparatus 100 shown in FIG. 3 and is mounted on the mounting table 112, the plasma etching process in accordance with the present embodiment is started. The plasma etching process is performed in the following manner by the control unit 200 based on the processing conditions (recipe) stored in the storage unit 220.

The control unit 200 executes the initial main etching in the steps S110 to S114 shown in FIG. 9. Specifically, in the step S110, it is determined whether or not $BCl_3$ gas is be added to the processing gas. At this time, if it is determined in the step S110 that $BCl_3$ gas is not added to the processing gas, the initial main etching is executed by generating a plasma of a processing gas to which $BCl_3$ gas is not added in step S112.

On the other hand, if it is determined in the step S110 that $BCl_3$ gas is added to the processing gas, the etching is executed in the step S114 by using a plasma of the processing gas to which $BCl_3$ gas is added at a predetermined flow rate ratio in the initial main etching. Accordingly, as shown in FIG. 8B, e.g., the SiN film 350 and a part of the laminated film 340 formed therebelow are etched, and holes of a predetermined depth are formed. The initial main etching is executed based on the processing conditions read out from the storage unit 220 storing therein the processing conditions.

Next, the second and following main etching are executed in the steps S210 to S220 a predetermined number of times. Specifically, it is determined in the step S210 whether or not $BCl_3$ gas is added to the processing gas. At this time, if it is determined that $BCl_3$ gas is not added to the processing gas, the second main etching is executed by generating a plasma of the processing gas to which $BCl_3$ gas is not added in the step S212.

On the other hand, if it is determined in the step S210 that $BCl_3$ gas is added to the processing gas, it is determined in the step S214 whether or not the flow rate ratio of $BCl_3$ gas is adjusted. At this time, if it is determined that the flow rate ratio of $BCl_3$ gas is adjusted, the flow rate ratio of $BCl_3$ gas is decreased in the step S216 and the second main etching is executed. On the contrary, if it is determined in the step S214 that the flow rate ratio of $BCl_3$ gas is not adjusted, the flow rate ratio of $BCl_3$ gas is not decreased and the second main etching is executed in the step S218.

In the case of adjusting the flow rate ratio in the second and subsequent main etching, the step S216 may be executed by reading out the flow rate ratio of $BCl_3$ gas based on the processing condition stored in the storage unit 220 whenever the main etching is repeated. Or, the step S216 may be executed by gradually changing the flow rate ratio of $BCl_3$ gas by a predetermined value whenever the main etching is repeated. In this case, the predetermined value may be previously stored in the storage unit 220 and read out therefrom or may be changed according to etching status while monitoring plasma emission or the like.

After the second main etching is completed, it is determined in the step S220 whether or not the etching has been executed a predetermined number of times. At this time, if it is determined that the execution number of the main etching does not reached a predetermined number, the processing returns to the step S210 and a next main etching step is executed. Accordingly, the laminated film 340 is further etched and the holes become deeper in the depth direction, as shown in FIGS. 8C to 8E, for example.

If it is determined in the step S220 that the main etching has been executed a predetermined number of times, the over etching is executed in the step S230. As described above, in the over etching, $BCl_3$ gas is not added. The flow rate ratio or the type of the processing gas used in the over etching step OE may be changed. For example, a flow rate of HBr gas in the processing gas may be decreased, or $C_4F_8$ gas in the processing gas may be changed to $CH_4$ gas that is a deposition gas. Further, the continuous waveform of the second high frequency bias power may be converted into the pulse form by pulse modulation to apply the second high frequency power in the pulse form. The over etching is executed by reading out the processing conditions previously stored in the storage unit 220.

In this manner, the bottom CD of the bottom portion of the hole can be increased while suppressing the etching in the depth direction to prevent the base film from being penetrated. As a result of the over etching, the etching proceeds to the base film 310 as shown in FIG. 8F, for example, and the holes of a desired depth are formed in the laminated film 340. When the over etching is completed, a series of etching processes is completed.

In accordance with the plasma etching process shown in FIG. 9, the additional gas (e.g., $BCl_3$ gas) for forming the protective film of the SiN layer 350 can be added to the processing gas at a predetermined flow rate ratio and at a predetermined timing from the initial main etching to the second and following main etching. Accordingly, the laminated film 340 can be etched while forming the protective film on the sidewall of the SiN layer 350 exposed to the recess (hole in this example). As a result, the flow rate ratio or the addition timing of the additional gas (e.g., $BCl_3$ gas) can be controlled according to the status of etching in the depth direction.

For example, the additional gas (e.g., $BCl_3$ gas) may be added in all the main etching steps or only in the initial main etching step. Further, the additional gas may be added from the initial main etching to a desired main etching. Moreover, the additional gas may not be added in the initial main etching and may be added only in the second and following main etching. The flow rate of the additional gas (e.g., $BCl_3$ gas) may be gradually decreased as the etching of the laminated film 340 proceeds. In this case, the timing of decreasing the flow rate ratio of the additional gas can be controlled. For example, the flow rate ratio may be decreased after every main etching step or after several main etching steps.

(Test Result)

Hereinafter, the test result obtained by performing etching to the laminated film including the SiN layer in accordance with the present embodiment will be described. Here, the case of using a processing gas added with $BCl_3$ gas for forming a protective film on the sidewall of the SiN layer (etching process of a test example in accordance with the present embodiment) was compared with the case of using a processing gas to which $BCl_3$ gas was not added (etching process of a comparative example). In both examples, holes were formed in the laminated film by executing four main etching steps consecutively in the respective etching processes.

The processing conditions in the respective etching steps are as follows. In the following processing conditions, flow rate ratios F1 to F4 of $BCl_3$ gas in the four main etching steps ME1 to ME4 were set to about 50 sccm in the etching process of the test example (using $BCl_3$ gas) and set to about 0 sccm in the etching process of the comparative example (without using $BCl_3$ gas). The other processing conditions are the same.

Figure 10:
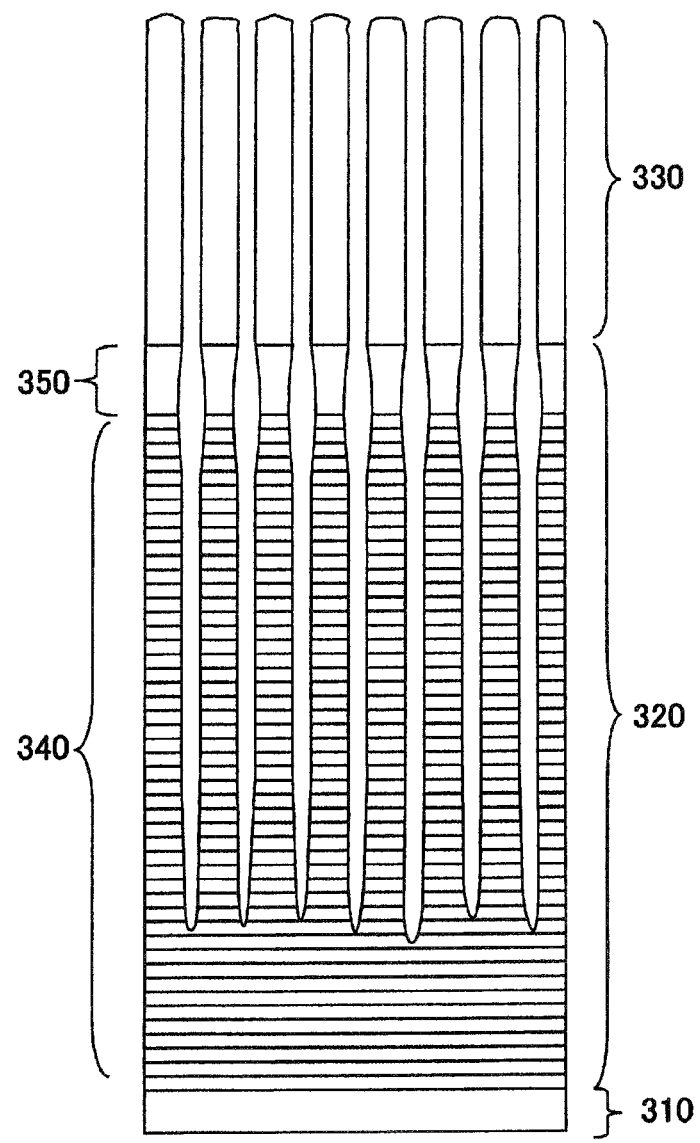
FIG. 10 is a scanning electron microscope image of a cross section of recesses and shows a test result of a comparative example in which etching is performed by using a processing gas to which $BCl_3$ gas is not added.
Figure 11:
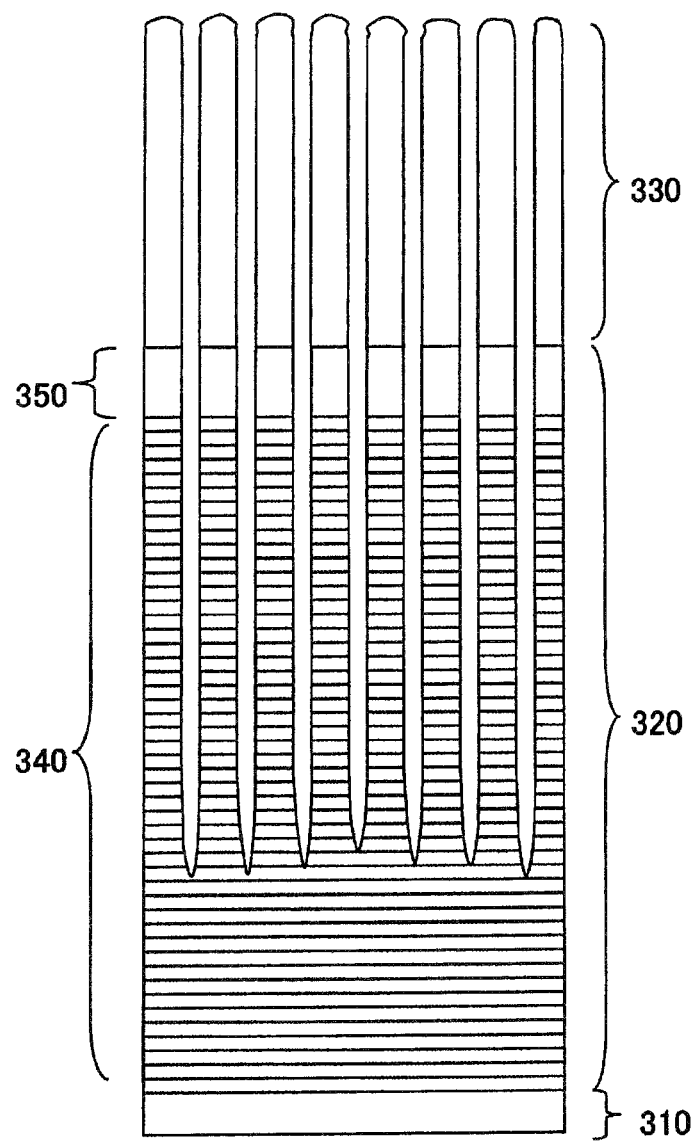
FIG. 11 is a scanning electron microscope image of a cross section of recesses and shows a test result of a test example in which etching is performed by using a processing gas to which $BCl_3$ gas is added.

[Processing Conditions of Etching in Test Example]
(Initial Main Etching ME1)
Pressure in processing chamber: 50 mTorr
Frequency/power of first high frequency power: 60 MHz/2000 W
Frequency/power of second high frequency power: 400 kHz/2000 W
Processing gas: $HBr/C_4F_8/BCl_3/Ar$=496/41/F1/100 sccm
Magnetic force: 454 Gauss
Etching time: 140 sec
(Second Main Etching ME2)
Pressure in processing chamber: 50 mTorr
Frequency/power of first high frequency power: 60 MHz/2000 W
Frequency/power of second high frequency power: 400 kHz/3000 W
Processing gas: $HBr/C_4F_8/BCl_3/Ar$=496/37/F2/100 sccm
Magnetic force: 454 Gauss
Etching time: 180 sec
(Third Main Etching ME3)
Pressure in processing chamber: 50 mTorr
Frequency/power of first high frequency power: 60 MHz/2000 W
Frequency/power of second high frequency power: 400 kHz/4000 W
Processing gas: $HBr/C_4F_8/BCl_3/Ar$=496/33/F3/100 sccm
Magnetic force: 454 Gauss
Etching time: 180 sec
(Fourth Main Etching ME4)
Pressure in processing chamber: 50 mTorr
Frequency/power of first high frequency power: 60 MHz/2000 W
Frequency/power of second high frequency power: 400 kHz/4000 W
Processing gas: $HBr/C_4F_8/BCl_3/Ar$=496/29/F4/100 sccm
Magnetic force: 454 Gauss
Etching time: 180 sec FIGS. 10 and 11 show test results obtained by performing etching under the above processing conditions. FIGS. 10 and 11 illustrate SEM (Scanning Electron Microscope) images showing a cross section of the recesses (holes in these examples) formed by the etching. FIG. 10 shows the test result obtained by performing etching in the comparative example (without using $BCl_3$ gas) and FIG. 11 shows the test result obtained by performing etching in the test example (without using $BCl_3$ gas) in accordance with the present invention.

Each film structure includes, from the upper side in FIGS. 10 and 11, a resist mask 330, a multilayer film 320 having a SiN layer 350 and a laminated film 340 ($SiO_2$ as a first film and a polysilicon film (doped with impurities) as a second film are alternately laminated), and a base film 310. A thickness of each layer in the laminated film 340 is about 30 nm, and 36 layers are laminated therein. A thickness of the resist mask 330 is about 1500 nm and a thickness of the SiN layer 350 is in a range of 40 nm to 140 nm. A thickness of each layer in the laminated film 340 is about 60 nm and 36 layers are laminated therein. The thickness of the resist mask 330 or the SiN layer 350, and the thickness of each layer or the number of laminated layers in the laminated layer 340 are not limited to the above. As for the base film 310, a high-k material may be used, for example.

In the etching process in the comparative example in which $BCl_3$ gas is not added, the side surface of the hole formed in the SiN layer 350 is etched and thus bowing occurs, as shown in FIG. 10. On the other hand, in the etching process in the test example in which $BCl_3$ gas is added, the side surface of the SiN layer 350 is not etched and the occurrence of bowing is suppressed, as shown in FIG. 11. The test results show that the occurrence of bowing is suppressed by using a processing gas obtained by adding $BCl_3$ gas to an etching gas for etching the laminated film 340.

While the invention has been shown and described with respect to the embodiments, it will be understood by those skilled in the art that various changes and modifications may be made without departing from the scope of the invention as defined in the following claims.

For example, in the above embodiment, holes (openings) are formed as recesses in the laminated film. However, the plasma processing method in accordance with the present invention can be applied to the case of forming a trench (groove) such as a line and space (L&S) as a recess in the laminated film.

Further, a substrate to be processed which is subjected to the plasma processing in the embodiment of the present invention is not limited to a semiconductor wafer and may also be, e.g., a large-sized substrate for use in a FPD (Flat Panel Display) or a substrate for use in an EL device or a solar cell.

INDUSTRIAL APPLICABILITY

The present invention can be applied to a plasma processing method and a plasma processing apparatus, for etching a multilayer film on a substrate to be processed by using a plasma.

DESCRIPTION OF REFERENCE NUMERALS

100: plasma processing apparatus
110: processing chamber
112: mounting table 114: cylindrical maintaining portion
116: cylindrical supporting portion
118: focus ring
120: gas exhaust path
122: baffle plate
124: gas exhaust port
126: gas exhaust pipe
128: gas exhaust unit
130: gate valve
133: matching unit
138: shower head
140: electrostatic chuck
140a: electrode
142: DC voltage supply
143: switch
152: heat transfer gas supply unit
154: gas supply line
156: electrode plate
156a: gas venthole
158: electrode holder
160: buffer chamber
160a: gas inlet port
162: processing gas supply unit
164: gas supply line
170: magnet
172: upper magnet
174: lower magnet
182: coolant line
184: chiller unit
186, 188: pipes
190: heater
192: AC power supply
200: control unit
210: manipulation unit
220: storage unit
310: base film
320: multilayer film
330: mask layer
340: laminated film
342: first film
344: second film
350: SiN layer
352: protective film
AC: active layer
W: wafer

What is claimed is:

1. A plasma processing method for plasma etching a multilayer film formed on a substrate to be processed in a processing chamber, the plasma processing method comprising:
generating a plasma of a processing gas while using a patterned mask layer as a mask,
wherein the multilayer film includes a laminated film in which first films and second films are alternately laminated and a silicon nitride layer is formed on the laminated film, wherein a dielectric constant of the first films is different from that of the second films,
wherein the plasma etching is performed multiple times by introducing into the processing chamber the processing gas containing a fluorocarbon-based gas and at least one of a bromine-containing gas, a chlorine-containing gas, and an iodine-containing gas, so that a recess is formed to gradually extend from the silicon nitride layer through the laminated film, and
wherein etching of the laminated film proceeds while forming a protective film on a sidewall of the silicon nitride layer exposed to the recess by adding a boron-containing gas to the processing gas at a predetermined flow rate ratio and at a predetermined timing.

2. The plasma processing method of claim 1, wherein the boron-containing gas is one of boron trifluoride, boron trichloride, and boron oxide.

3. The plasma processing method of claim 1, wherein a temperature of the substrate to be processed is controlled in a range from 150° C. to 200° C. during the plasma etching performed multiple times.

4. The plasma processing method of claim 1, wherein each of the first films and each of the second films are respectively a silicon oxide film and a polysilicon film.

5. The method of claim 1, wherein the protective film is formed of boron nitride.

6. The plasma processing method of claim 1, wherein the boron-containing gas is introduced at least in an initial plasma etching.

7. The plasma processing method of claim 6, wherein in the initial plasma etching, the flow rate ratio of the boron-containing gas with respect to the bromine-containing gas is set in a range from 10% to 40%.

8. The plasma processing method of claim 1, wherein the substrate is mounted on a lower electrode in the processing chamber where an upper electrode and the lower electrode are disposed opposite to each other, and
wherein a high frequency bias power is applied to the lower electrode to be increased as the etching of the laminated film proceeds.

9. The plasma processing method of claim 8, wherein the high frequency bias power applied to the lower electrode is increased whenever the plasma etching is executed a predetermined number of times.

10. The plasma processing method of claim 1, wherein the boron-containing gas is introduced from an initial plasma etching to a plasma etching of a predetermined cycle.

11. The plasma processing method of claim 10, wherein the boron-containing gas is introduced from the initial plasma etching to a final plasma etching.

12. The plasma processing method of claim 10, wherein the flow rate ratio of the boron-containing gas is gradually decreased as the etching of the laminated film proceeds.

13. The plasma processing method of claim 12, wherein the flow rate ratio of the boron-containing gas is decreased whenever the plasma etching is executed a predetermined number of times.

* * * * *